(12) United States Patent
Tu et al.

(10) Patent No.: US 7,581,312 B2
(45) Date of Patent: Sep. 1, 2009

(54) METHOD FOR MANUFACTURING MULTILAYER FLEXIBLE PRINTED CIRCUIT BOARD

(75) Inventors: Chih-Yi Tu, Tayuan (TW); Cheng-Hsien Lin, Tayuan (TW); Ming Wang, Shenzhen (CN)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 0 days.

(21) Appl. No.: 11/877,585

(22) Filed: Oct. 23, 2007

(65) Prior Publication Data

US 2008/0148562 A1    Jun. 26, 2008

(30) Foreign Application Priority Data

Dec. 20, 2006    (CN) .................. 2006 1 0157702

(51) Int. Cl.
*H05K 3/20*    (2006.01)

(52) U.S. Cl. ............................. 29/831; 29/830; 29/841; 29/837; 29/852; 174/262; 174/264

(58) Field of Classification Search .................. 29/831, 29/830, 841, 837, 846, 852; 174/262, 264
See application file for complete search history.

(56) References Cited

U.S. PATENT DOCUMENTS 6,687,984 B1 *    2/2004    Toyoshima et al. ........... 29/830

* cited by examiner

*Primary Examiner*—A. Dexter Tugbang
*Assistant Examiner*—Dan D Le
(74) *Attorney, Agent, or Firm*—Frank R. Niranjan

(57) ABSTRACT

A method for manufacturing a multilayer FPCB includes the steps of: providing a first copper clad laminate, a second copper clad laminate and a binder layer; defining an opening on the binder layer; defining a first slit on the first copper clad laminate; laminating the first copper clad laminate, the binder layer and the second copper clad laminate; defining a via hole for establishing electric connection between the first copper clad laminate and the second copper clad laminate; cutting the first copper clad laminate, the binder layer and the second copper clad laminate thereby forming a multilayer flexible printed circuit board having different numbers of layers in different areas.

13 Claims, 30 Drawing Sheets

METHOD FOR MANUFACTURING MULTILAYER FLEXIBLE PRINTED CIRCUIT BOARD

BACKGROUND

1. Technical Field

The present invention relates to a method for manufacturing a flexible printed circuit board, and especially to a method for manufacturing a multilayer flexible printed circuit board having different number of layers in different areas.

2. Discussion of Related Art

Flexible printed circuit boards (FPCBs) have been widely used in electronic products such as mobile phones, printing heads and hard disks. In these electronic products, some parts may move relative to a main body. FPCBs can assure power supply and signal transmission in such environment due to their excellent flexibility.

FIG. 30 shows a multilayer FPCB structure, which has different numbers of layers in different areas; in other words, there are thick areas and thin areas within the same FPCB. The thick area can have a higher circuit density whilst the thin area exhibits higher flexibility.

FIGS. 25-30 show a process for manufacturing such a type of FPCB. As is shown in FIGS. 25 and 26, a first copper clad laminate (CCL) 41, a binder layer 45 and a second CCL 42 are laminated. As is shown in FIG. 27, dry films 412, 422 are applied on the first CCL 41 and the second CCL 42 respectively and then the dry films 412, 422 are exposed and developed. Because there is a cliff-like thickness difference between the first CCL 41 and the second CCL 42, a gap 46 is formed at 'cliff'.

As is shown in FIG. 28, when the first CCL 41 and the second CCL 42 are etched using an etchant and the dry films 412, 422 are removed, the etchant can seep into the gap 46 and react with dielectric layers in the first CCL 41 and the second CCL 42. As a result the dielectric layers may peel from the CCL.

Referring to FIG. 29, a third CCL 43 and a fourth CCL 44 are laminated with the first CCL 41 and the second CCL 42. Referring to FIG. 29, a via hole 47 is formed. The via hole 47 can be made by drilling or by laser ablation. After the via hole 47 is formed a conductive layer is formed on a surface of the via hole 47 by electroless plating or electroplating. In the plating process the dielectric layer of the second CCL 42 is exposed to a plating solution, thereby forming a number of copper lumps thereon. These copper lumps can pierce dry film that is applied onto the second CCL 42 in the next pattern-forming process, and etchant used for developing the dry film can react with dielectric layer or copper layer of second CCL 42 and cause poor quality products to be formed.

In the aforementioned process for manufacturing multilayer FPCB that has different number of layers in different areas, a cliff-like structure between different CCLs can causes a series of quality problems, therefore there is a desire to develop a process that can solve aforementioned quality problems.

SUMMARY OF THE INVENTION

This and other features and advantages of the present invention as well as the preferred embodiments thereof and a metal nanowire array and techniques for fabricating metal nanowire array in accordance with the invention will become apparent from the following detailed description and the descriptions of the drawings.

In one embodiment, a method for manufacturing a multilayer FPCB includes the steps of: firstly, providing a first copper clad laminate, a second copper clad laminate and a binder layer. The first copper clad laminate and the second copper clad laminate each including at least one single-sided copper clad laminate, the single-sided copper clad laminate includes a dielectric layer and a conductive layer formed on the dielectric layer. The first copper clad laminate having an excess portion. Secondly, defining an opening in the binder layer. Thirdly, defining a first slit in the first copper clad laminate along a boundary of the excess portion of the first copper clad laminate. Fourthly, laminating the first copper clad laminate, and the second copper clad laminate on opposite sides of the binder layer in a manner such that a majority of the excess portion of the first copper clad laminate is exposed to and suspended above the opening of the binder layer. Fifthly, forming a via hole for establishing an electric connection between the first copper clad laminate and the second copper clad laminate. Finally, defining a second slit in the first copper clad laminate along the boundary of the excess portion of the first copper clad laminate so as to remove the excess portion of the first copper clad laminate, thus a portion of the second copper clad laminate being exposed to an exterior through the opening of in the binder layer.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 1:
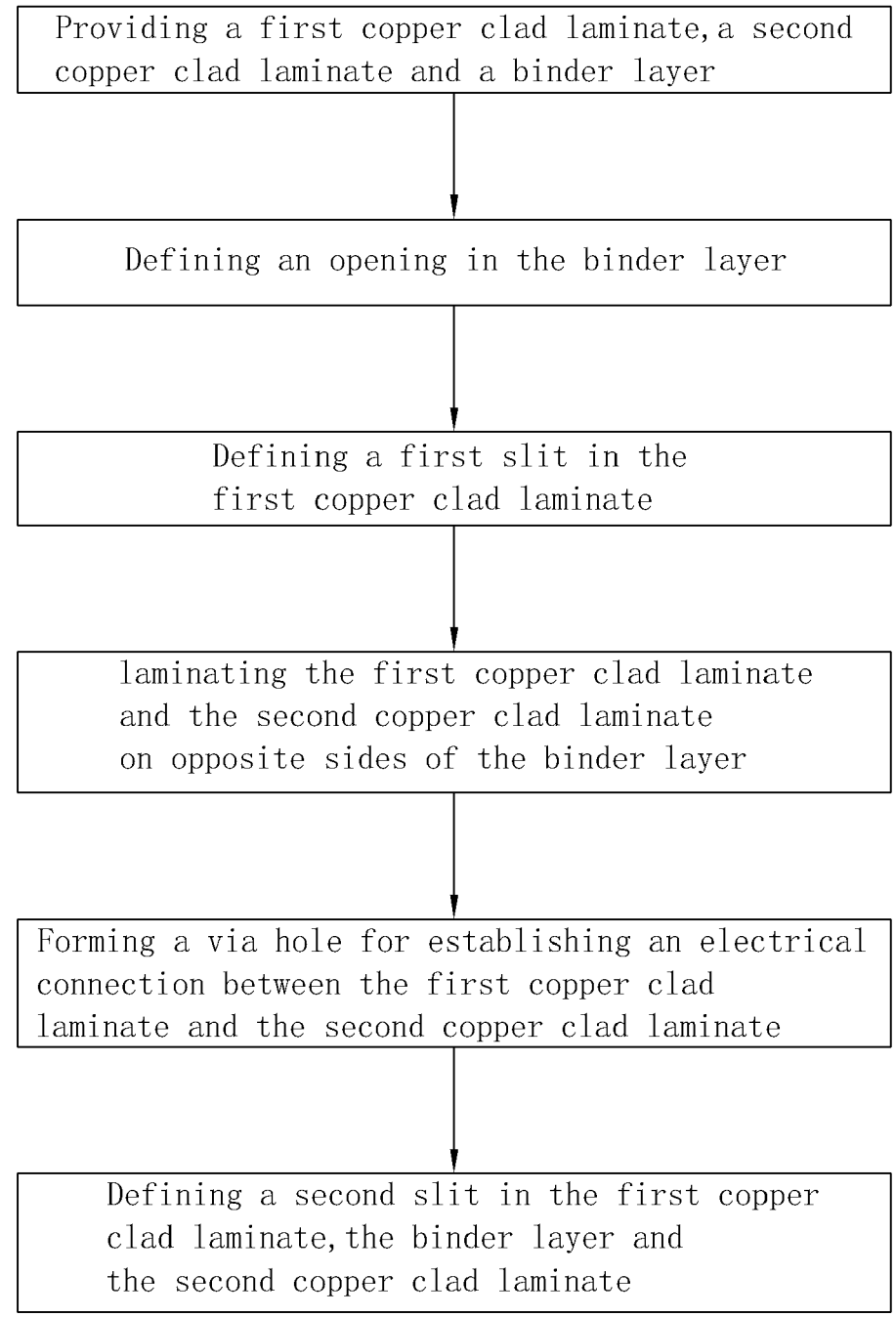
FIG. 1 is a flow chart shows a method for manufacturing a multilayer FPCB having different number of layers in different areas.

Referring to FIG. 1, a method for manufacturing a multilayer FPCB having different number of layers in different areas includes the steps in no particular order of:

providing a first copper clad laminate, a second copper clad laminate and a binder layer;

defining an opening in the binder layer;

defining a first slit in the first copper clad laminate;

laminating the first copper clad laminate and the second copper clad laminate on opposite sides of the binder layer;

forming a via hole for establishing an electric connection between the first copper clad laminate and the second copper clad laminate; and defining a second slit in the first copper clad laminate.

The method will be discussed in detail with the following preferred embodiments:

FIGS. 2-12 show a process for manufacturing a FPCB that has different number of layers in different areas in accordance with a first preferred embodiment.

Figure 2:
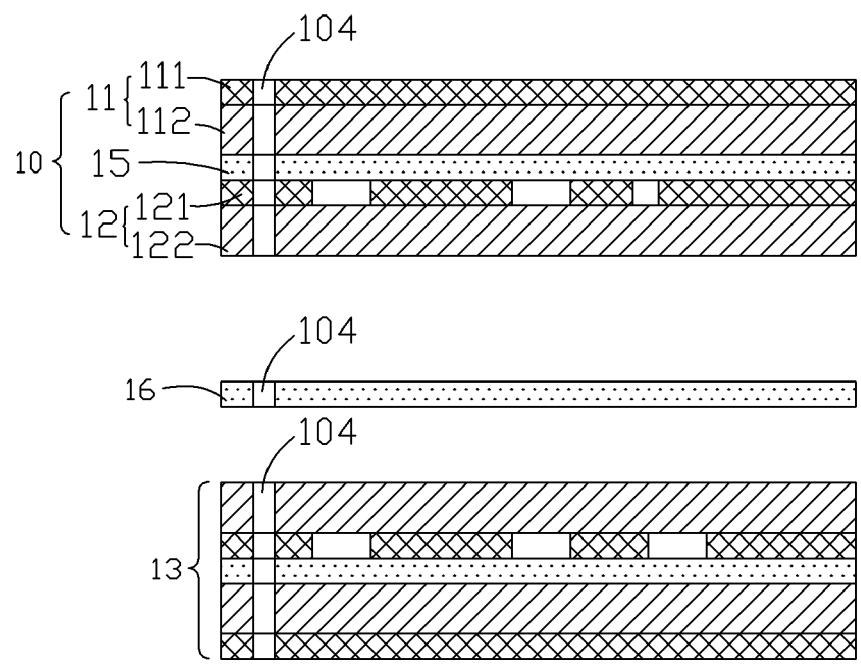
FIGS. 2 to 12 are schematic views show a process for manufacturing a multilayer FPCB having different number of layers in different areas in accordance with first preferred embodiment.

Referring to FIG. 2, a first copper clad laminate 10 includes two single-sided copper clad laminates 11 and 12. The single-sided copper clad laminate 11 includes a dielectric layer 112 and a conductive layer 111 formed on the dielectric layer 112. The single-sided copper clad laminate 12 includes a dielectric layer 122 and a conductive layer 121 formed on the dielectric layer 122. The single-sided copper clad laminates 11 and 12 are conglutinated by binder layer 15. The second copper clad laminate 13 has a similar structure with the first copper clad laminate 10. The binder layer 16 is used for conglutinating the first copper clad laminate 10 and the second copper clad laminate 13. Preferably, a locating hole 104 can be formed in the first copper clad laminate 11, the binder layer and the second copper clad laminate.

Materials of the dielectric layers and the binder layers can be selected from the group consisting of polyimide, polytetrafluoroethylene, polythiamine, polymethacrylic acid, polycarbonate, polycarbonate ester, polyester, and copolymer of imide, ethylene and dimethyl terephthate. The conductive layers can be a film of copper, silver or aluminum.

Figure 3:
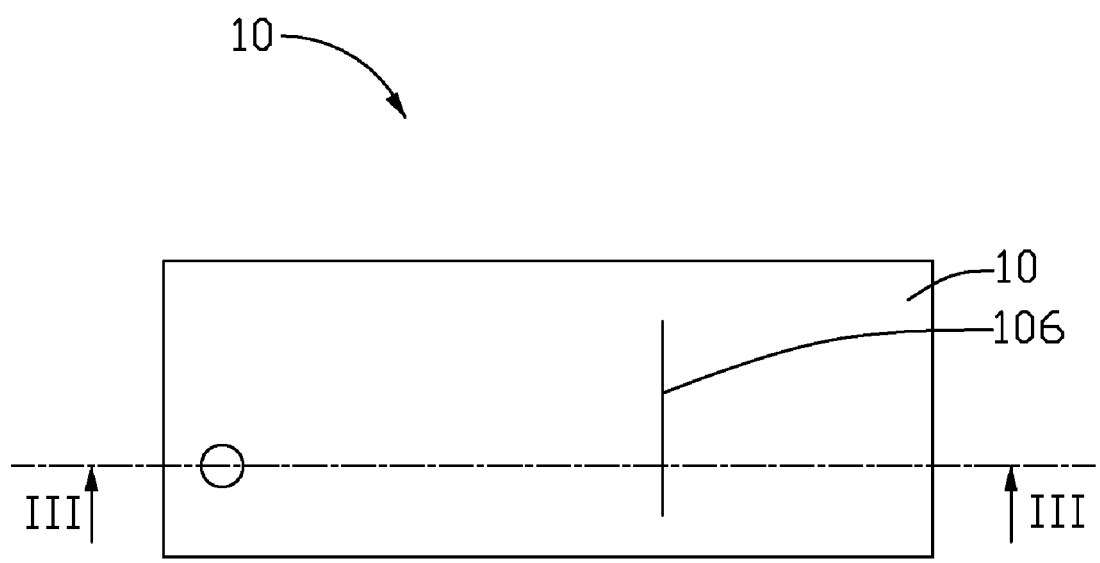
Figure 4:
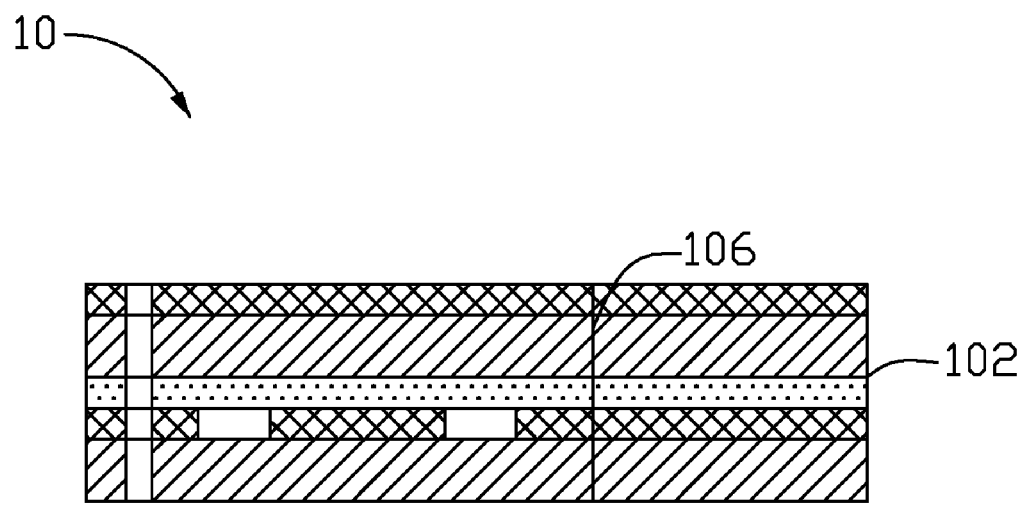

Referring to FIGS. 3 and 4, the first copper clad laminate 10 includes an excess portion 102 (i.e. a sacrificing portion which will be removed in a later step), a first slit 106 is formed along a boundary of the excess portion 102. A length of the first slit 106 is less than a width of the first copper clad laminate 10. The first slit 106 can be formed by stamping or laser ablation. In this preferred embodiment, the first slit 106 is formed by stamping.

Figure 5:
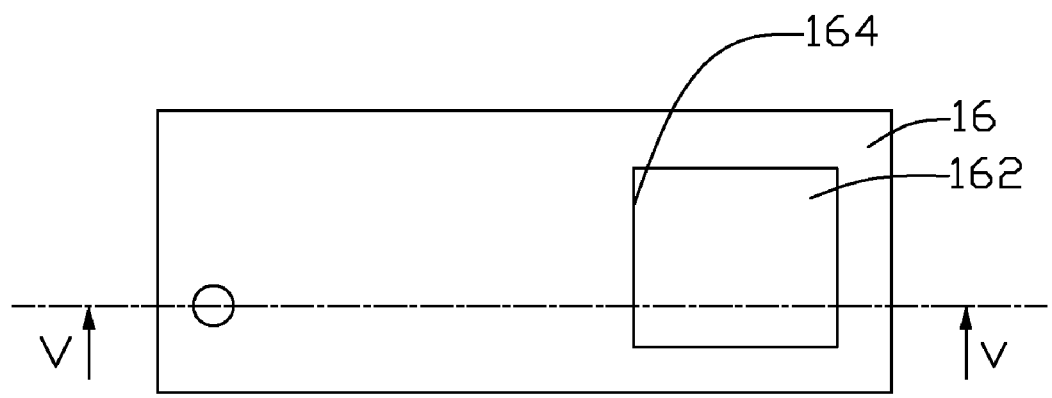
Figure 6:
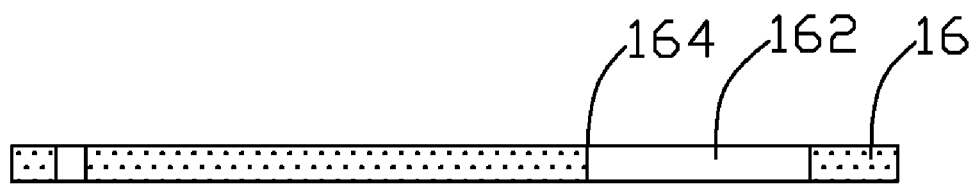

Referring to FIGS. 5 and 6, an opening 162 is formed in the binder layer 16 thereby an inner side wall surface 164 of the binder layer 16 is formed. The opening 162 can be formed by cutting, stamping, laser ablation or etching. In this preferred embodiment, the opening 162 has a rectangular shape, but the opening 162 can also be of other shape, for example, trapezium, triangle etc.

Figure 7:
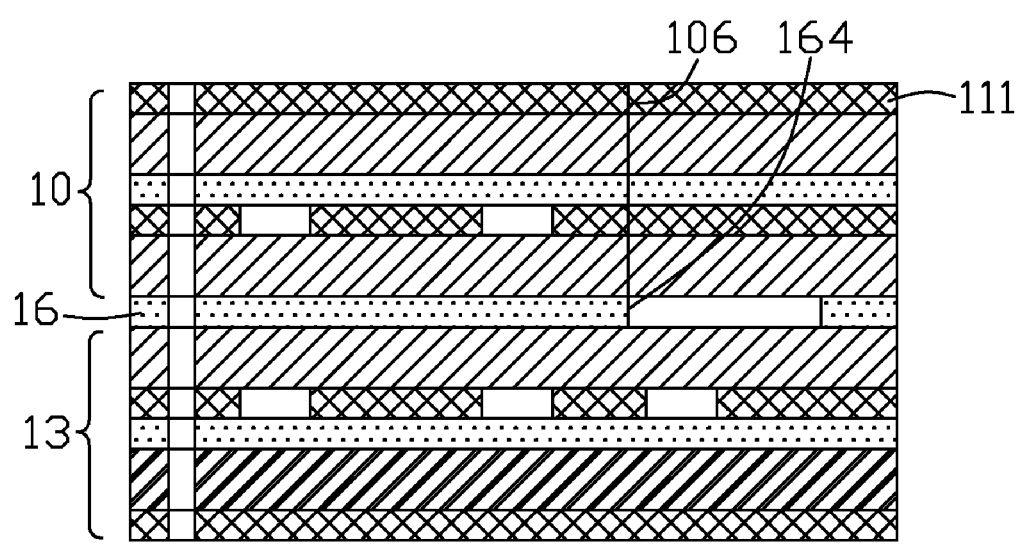

Referring to FIG. 7, the first copper clad laminate 10, the binder layer 16 and the second copper clad laminate 13 are laminated. In this preferred embodiment, the first slit 106 is aligned with the inner side wall surface 164. If there are locating holes on the first copper clad laminate, the binder layer 16, aligning with the first slit 106 and the inner side wall surface 164 can be achieved using the locating holes. The first slit 106 can also be separated from the inner side wall surface 164 1 to 2 millimeters in the direction away from the opening 162, in this manner, the first slit 106 is not directly in communication with the opening 162, therefore liquid such as etchant cannot seep through the first slit 106 into the opening 162. In other words, a majority of the excess portion 102 of the first copper clad laminate 10 is exposed to and suspended above the opening 162 of the binder layer 16.

Figure 8:
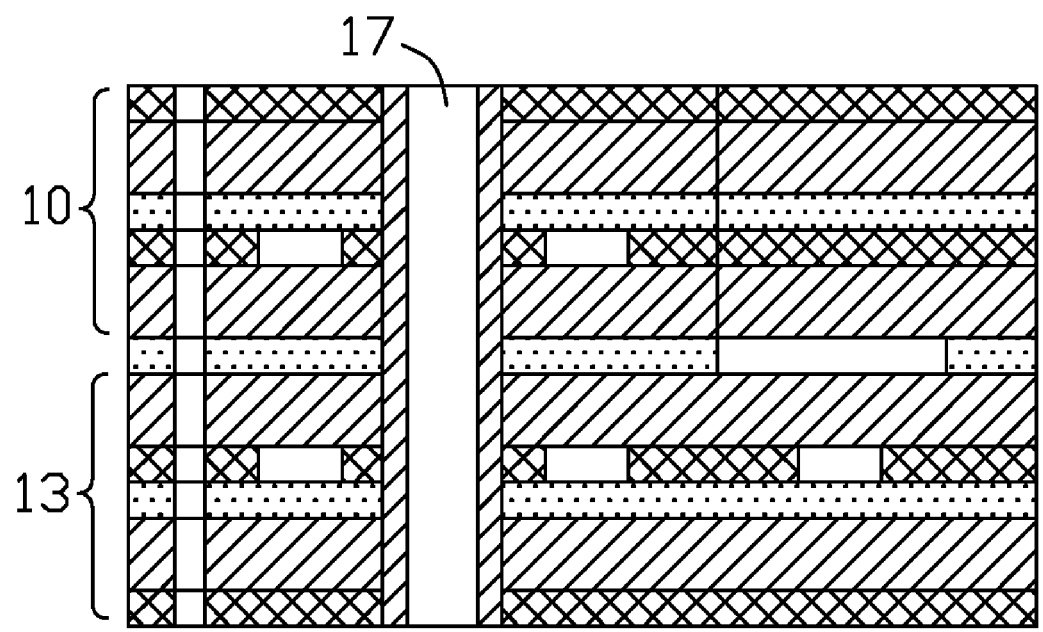

Referring to FIG. 8, a via hole 17 is formed. The via hole 17 establishes an electrical connection between the first copper clad laminate 10 and the second copper clad laminate 13.

Figure 9:
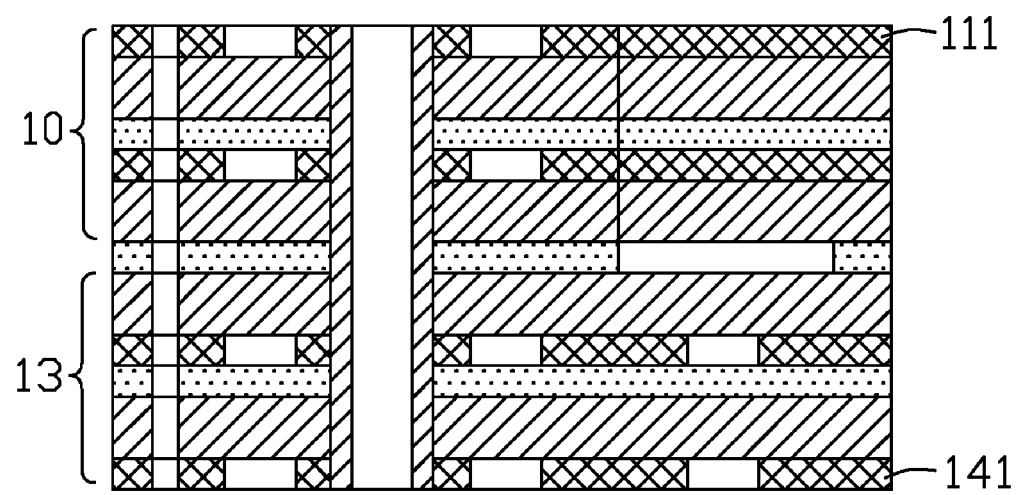

Referring to FIG. 9, conductive patterns are formed in outer surfaces of the first copper clad laminate 10 and the second copper clad laminate 13, in other words, conductive patterns are formed in conductive layers 111 and 141.

Figure 10:
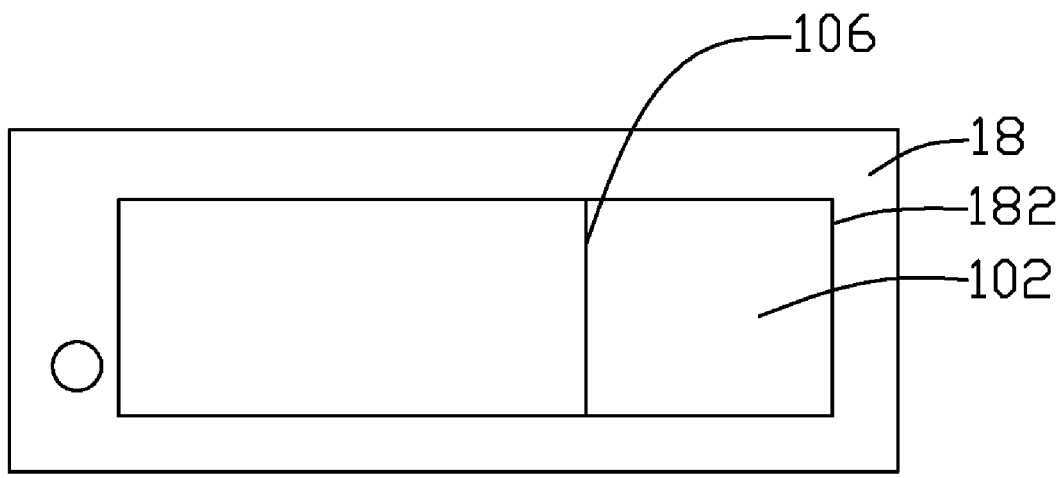
Figure 11:
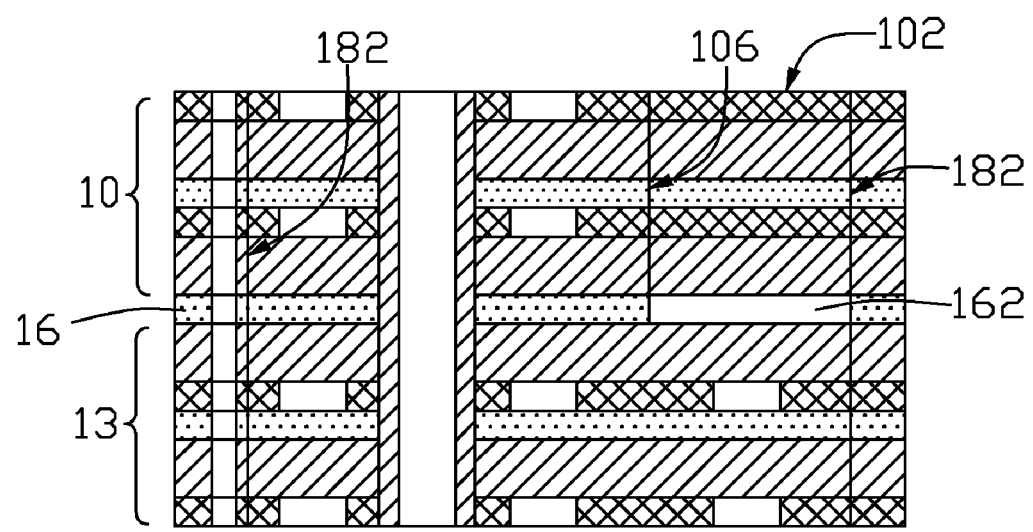

Referring to FIGS. 10 and 11, the first copper clad laminate 10, the binder layer 16 and the second copper clad laminate 13 are cut thereby forming a second slit 182. The second slit 182 defines a profile of a FPCB. Referring to FIG. 11, the second slit 182 and the first slit 106 surround the excess portion 102 of the first copper clad laminate 10. The excess portion 102 is not conglutinated by the binder layer 16 and is therefore very easy to remove.

Figure 12:
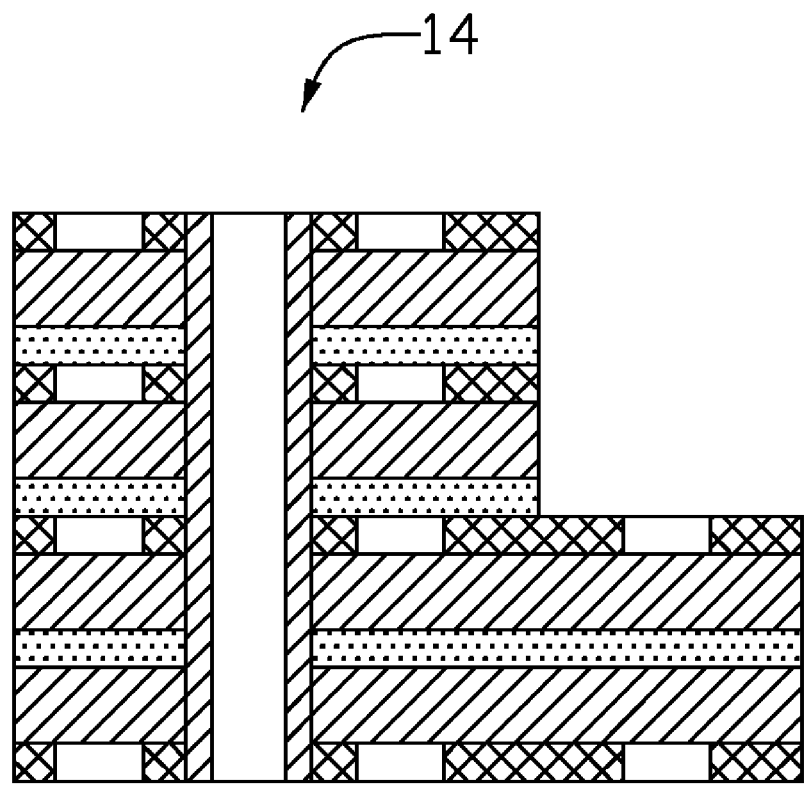

Referring to FIG. 12, the portion 102 is removed thereby a multilayer FPCB 14 having different number of layers in different areas is obtained.

In the preferred embodiment, there is no cliff-like structure between the first copper clad laminate 10 and the second copper clad laminate 13, thus avoiding the aforementioned problems.

Figure 13:
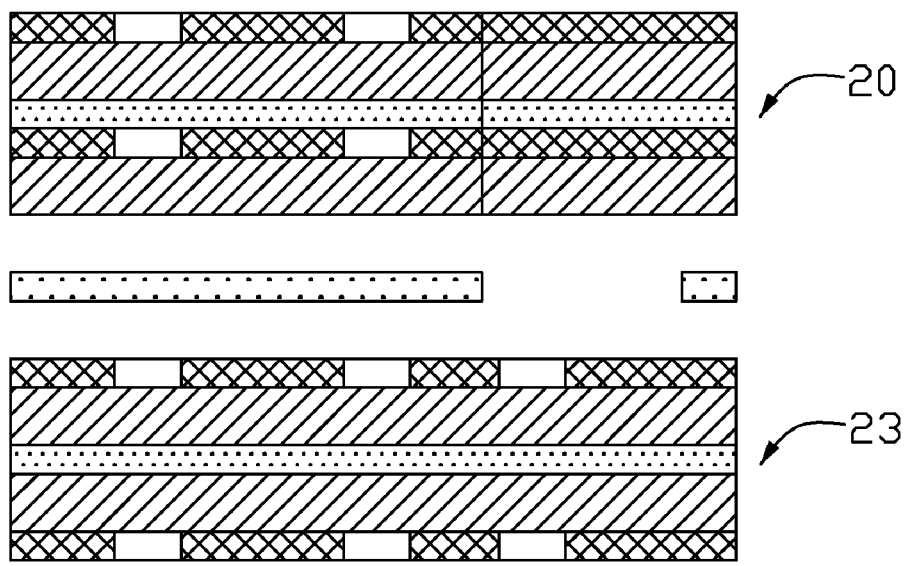
FIGS. 13 to 17 are schematic views show a process for manufacturing a multilayer FPCB having different number of layers in different areas in accordance with the second preferred embodiment.

The method for manufacturing a multilayer FPCB having different numbers of layers in different areas in accordance with the second preferred embodiment is similar to that of the first preferred embodiment, referring to FIG. 13. However, the conductive patterns on outer surfaces of the first copper clad laminate 20 and the second copper clad laminate 23 are formed before the first copper clad laminate 20 and the second copper clad laminate 23 are laminated.

Figure 14:
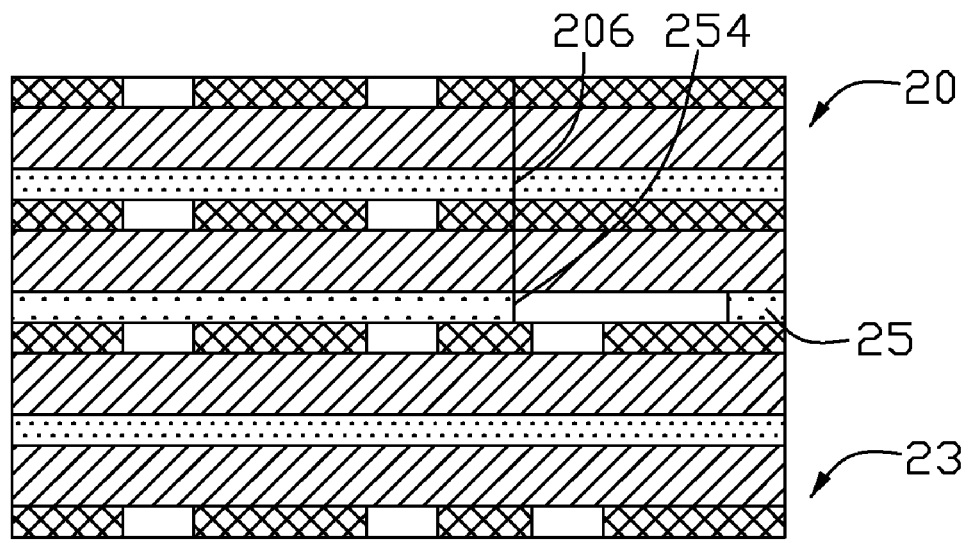

Referring to FIG. 14, the first copper clad laminate 20 and the second copper clad laminate 23 are laminated, and the first copper clad laminate 20 and the second copper clad laminate 23 are conglutinated by the binder layer 25. The first slit 206 is aligned with the side 254.

Figure 15:
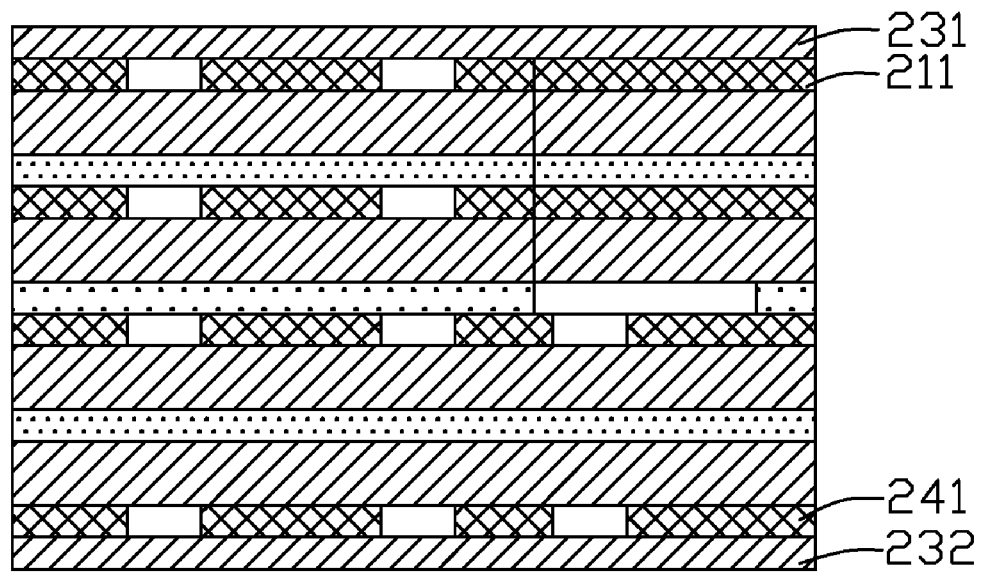

Referring to FIG. 15, protecting films 231 and 232 are applied on the conductive layers 211 and 241 respectively. The protecting films 231 and 232 are used for protecting the conductive layers 211 and 241 from being attacked by an etchant used in the next process.

Figure 16:
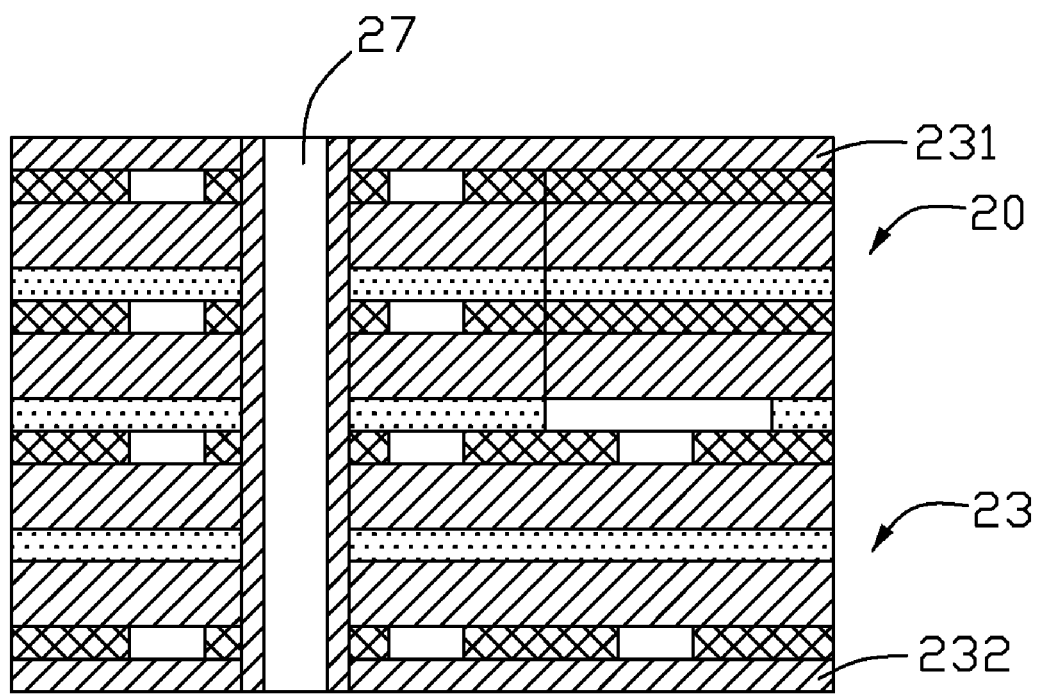

Referring to FIG. 16, a via hole 27 is formed. After the via hole 27 is formed the protecting films 27 are removed.

Figure 17:
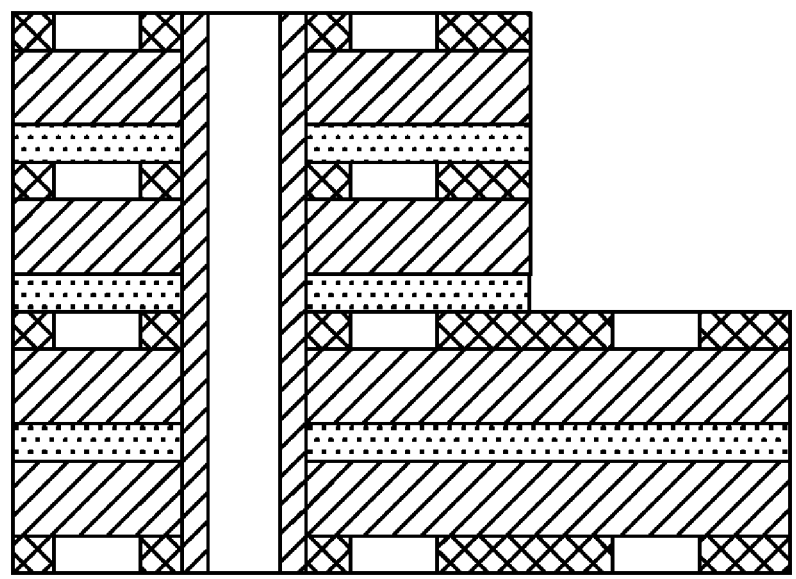

Referring to FIG. 17, finally, the first copper clad laminate 20, the binder layer 25 and the second copper clad laminate 23 are cut in a manner similar to that in the first preferred embodiment and therefore a multilayer FPCB 24 having different numbers of layers in different areas is obtained.

FIGS. 18 to 24 show a process for manufacturing a multilayer FPCB having different number of layers in different areas in accordance with third preferred embodiment.

Figure 18:
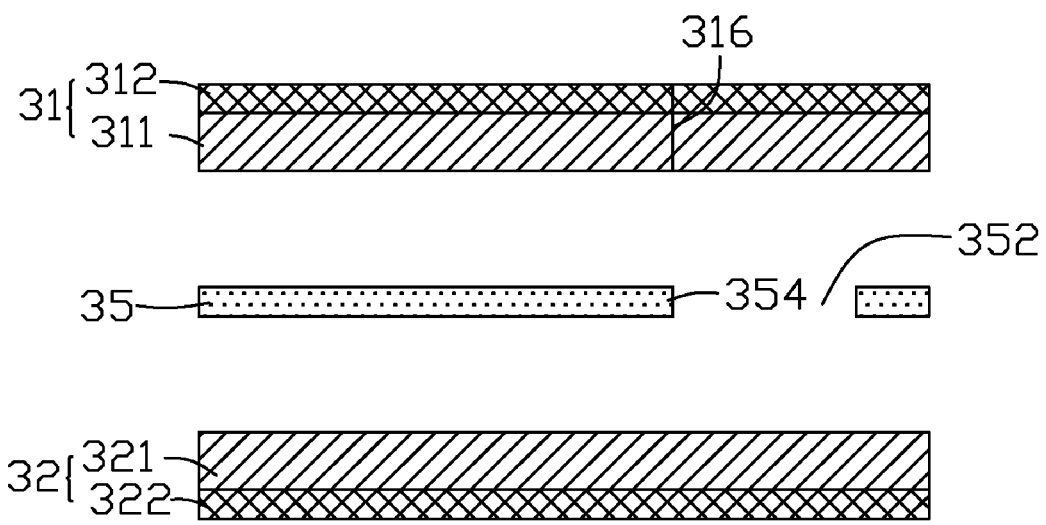
FIGS. 18 to 24 are schematic views show a process for manufacturing a multilayer FPCB having different number of layers in different areas in accordance with the third preferred embodiment.

Referring to FIG. 18, the first single-sided copper clad laminate 31 includes a dielectric layer 311 and a conductive layer 312 formed on the dielectric layer 311, a slit 316 is preformed on the first copper clad laminate 31. The second single-sided copper clad laminate 32 includes a dielectric layer 321 and a conductive layer 322 formed on the dielectric layer 321. The binder layer 35 includes a preformed opening 352 and a side 354 corresponding to the opening 352.

Figure 19:
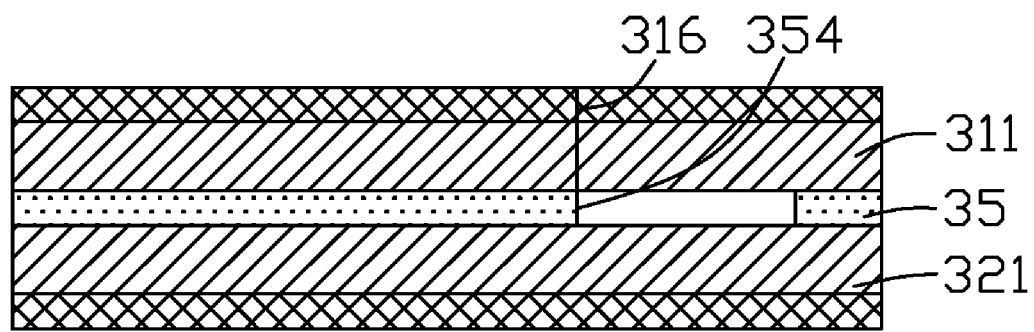

Referring to FIG. 19, the first single-sided copper clad laminate 31, the binder layer 35 and the second single-sided copper clad laminate 32 are laminated. The slit 316 is aligned with the side 354.

Figure 20:
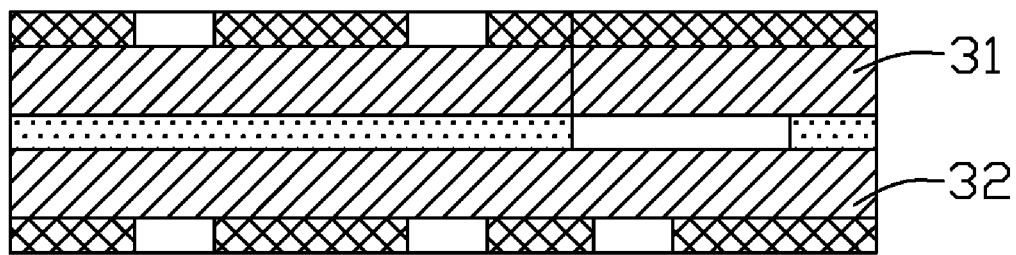

Referring to FIG. 20, conductive patterns are formed on the first single-sided copper clad laminate 31 and the second single-sided copper clad laminate 32. The slit 336 is aligned with the slit 316.

Figure 21:
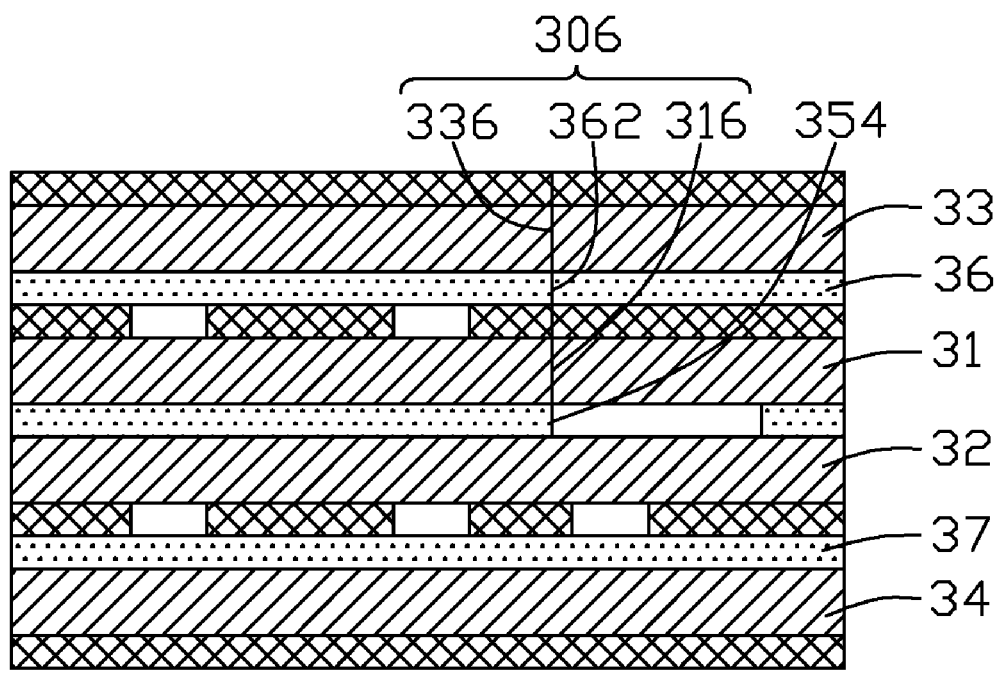

Referring to FIG. 21, a first single-sided copper clad laminate 33 and a second single-sided copper clad laminate 34 are applied on and then laminated with the first single-sided copper clad laminate 31 and the second single-sided copper clad laminate 32 respectively. The binder layer 36 conglutinates the first single-sided copper clad laminate 31 and 33. The binder layer 37 conglutinates the second single-sided copper clad laminate 32 and 34. The first single-sided copper clad laminate 33 has a similar structure to the first copper clad laminate 31. A slit 336 is preformed on the first single-sided copper clad laminate 33. A slit 362 is preformed on the binder layer 36. The slit 316, 336 and 362 are aligned with the side 354 thereby constitute a slit 306.

Figure 22:
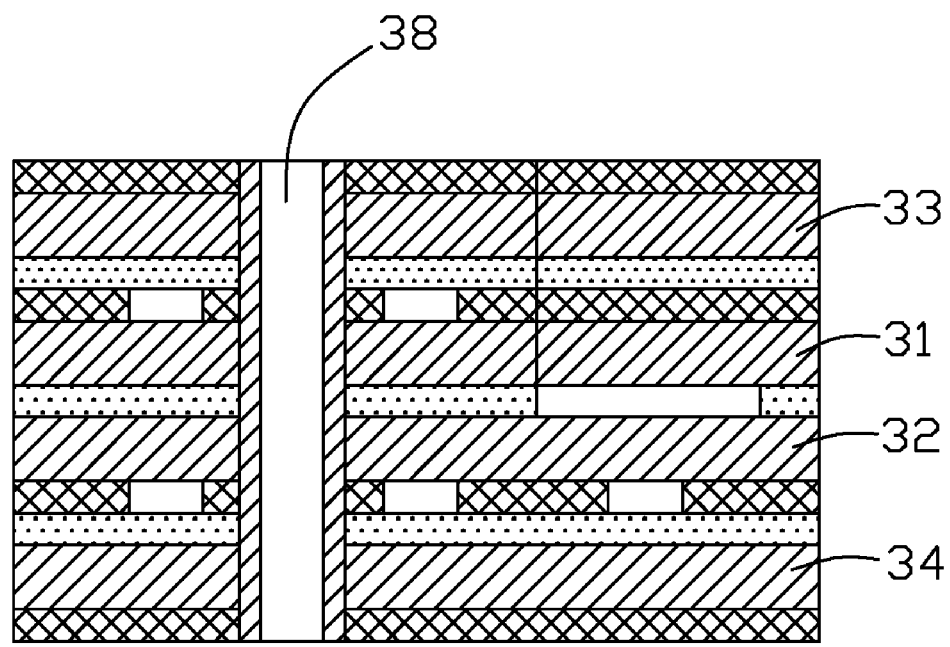

Referring to FIG. 22, a via hole 38 is formed. The via hole 38 is used for conducting the first copper clad laminate 31, 33 and the second copper clad laminate 32, 34.

Figure 23:
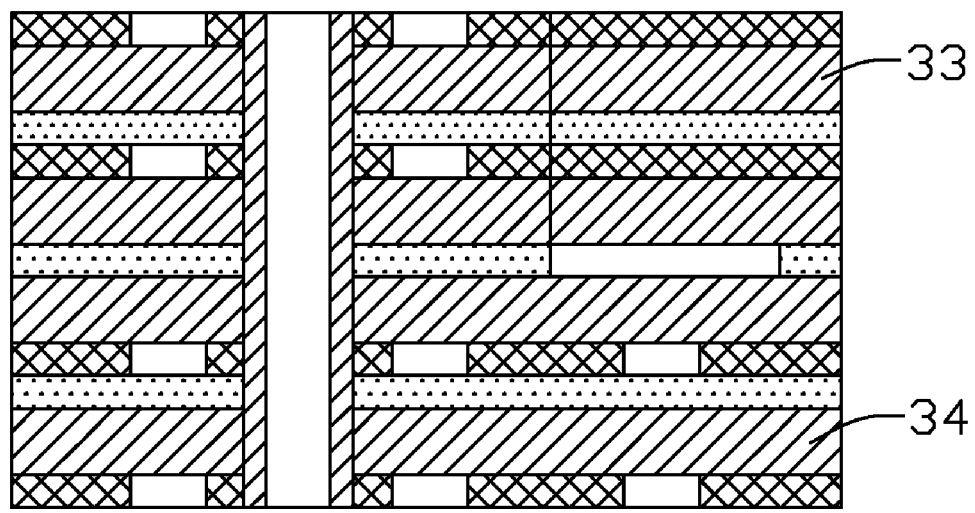

Referring to FIG. 23, conductive patterns are formed on outer surfaces of the first copper clad laminate 33 and the second copper clad laminate 34.

Figure 24:
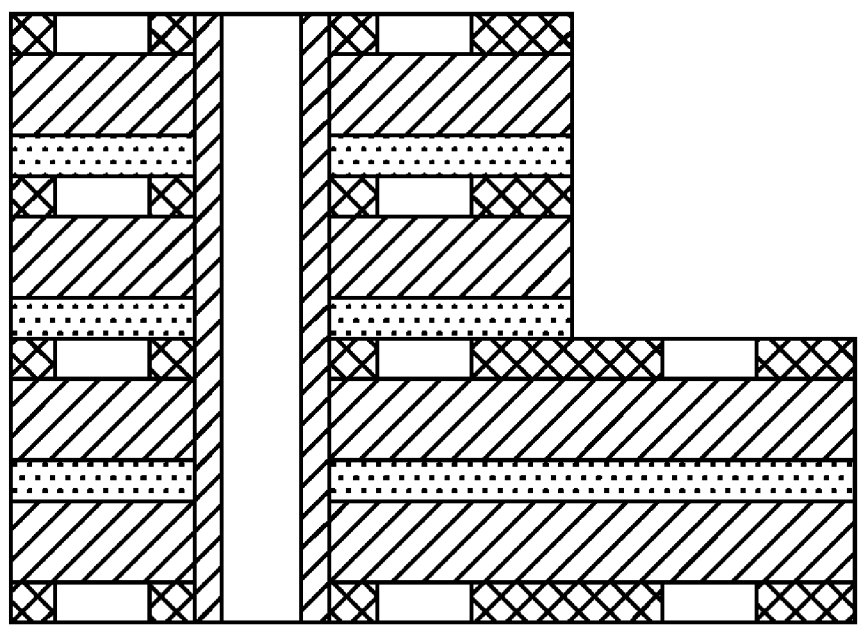
Figure 25:
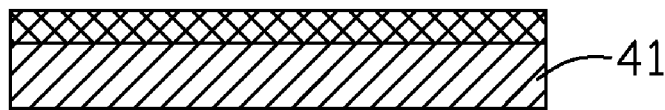
FIGS. 25 to 30 are schematic views show a process in related art for manufacturing a multilayer FPCB having different number of layers in different areas in accordance with related art.
Figure 25:
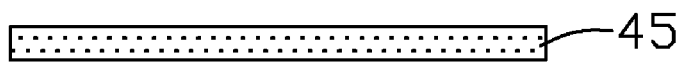
Figure 25:
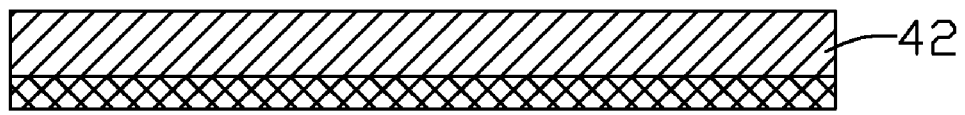
Figure 26:
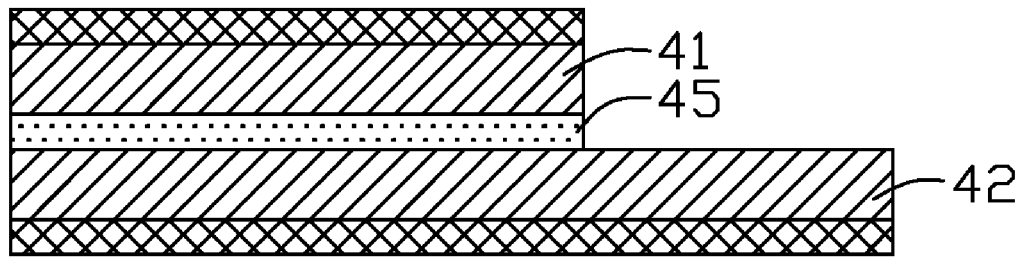
Figure 27:
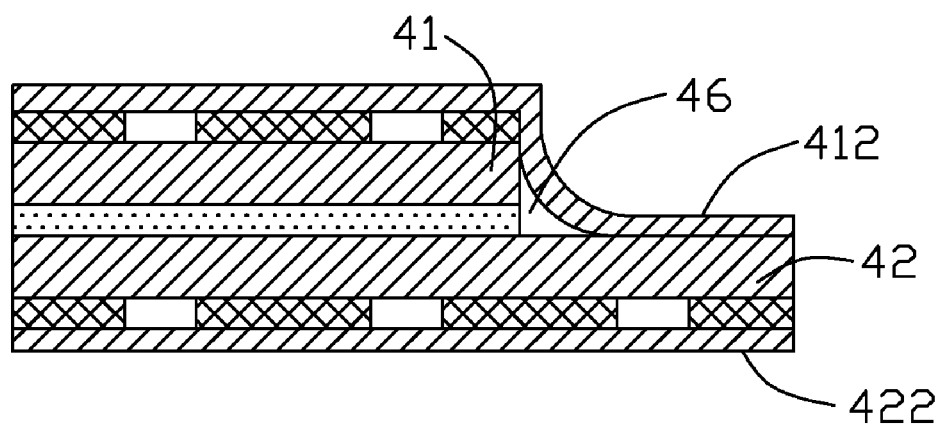
Figure 28:
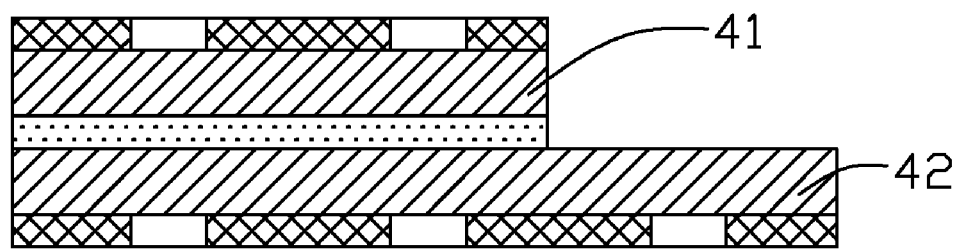
Figure 29:
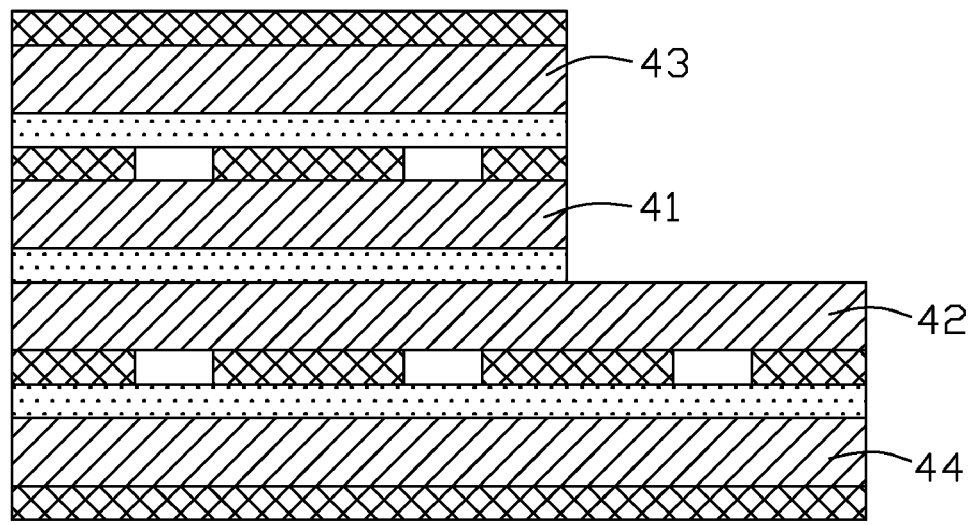
Figure 30:
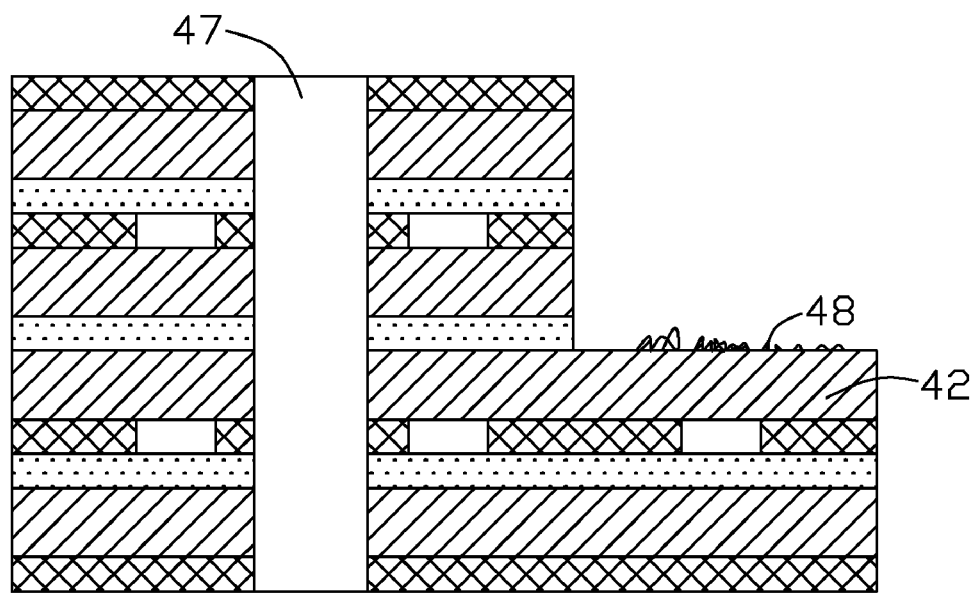

Referring to FIG. 24, the first copper clad laminates 31 and 33, the second copper clad laminates 32 and 34, and binder layers 35, 36 and 37 are cut in manner similar to that of the first preferred embodiment, therefore a multilayer FPCB having different number of layers in different areas is obtained.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for manufacturing a multilayer flexible printed circuit board, the method comprising steps of:
providing a first copper clad laminate, a second copper clad laminate and a binder layer, the first copper clad laminate and the second copper clad laminate each including at least one single-sided copper clad laminate, the at least one single-sided copper clad laminate including a dielectric layer and a conductive layer formed on the dielectric layer, the first copper clad laminate having an excess portion;
defining an opening in the binder layer;
defining a first slit in the first copper clad laminate along a boundary of the excess portion of the first copper clad laminate;
laminating the first copper clad laminate, and the second copper clad laminate on opposite sides of the binder layer in a manner such that a majority of the excess portion of the first copper clad laminate is exposed to and suspended above the opening of the binder layer;
forming a via hole for establishing an electric connection between the first copper clad laminate and the second copper clad laminate;
defining a second slit in the first copper clad laminate along the boundary of the excess portion of the first copper clad laminate so as to remove the excess portion of the first copper clad laminate, thus a portion of the second copper clad laminate being exposed to an exterior through the opening of in the binder layer.

2. The method as claimed in claim 1, wherein the opening of the binder layer is defined by stamping, laser ablation, or etching.

3. The method as claimed in claim 1, wherein the first copper clad laminate is made by a method includes steps of: providing a first single-sided copper clad laminate defining a slit in the first single-sided copper clad laminate, providing a second single-sided copper clad laminate, defining a slit in the second single-sided copper clad laminate, laminating the second single-sided copper clad laminate on the first single-sided copper clad laminate in a manner such that the slits of the first and second single-sided copper clad laminates are aligned with each other.

4. The method as claimed in claim 1, further comprising a step of forming an outermost conductive layer of at least one of the first copper clad laminate and the second copper clad laminate into a patterned conductive layer.

5. The method as claimed in claim 4, wherein a protecting film are formed on an outer surfaces of the first copper clad laminate and the second copper clad laminate prior to forming the via hole.

6. The method as claimed in claim 5, further comprising a step of removing the protecting film after formation of the via hole.

7. The method as claimed in claim 5, wherein the protecting film is a dry film.

8. The method as claimed in claim 1, wherein the excess portion of the first copper clad laminate is removed by stamping or laser ablation.

9. The method as claimed in claim 1, further comprising the step of laminating a third copper clad laminate on at least one of the first copper clad laminate and the second copper clad laminate, the third copper clad laminate including a dielectric layer and a conductive layer formed thereon.

10. The method as claimed in claim 1, further comprising a step of defining a locating hole in the first copper clad laminate and the binder layer.

11. The method as claimed in claim 1, wherein a material of the conductive layer is selected from the group consisting of copper, silver and aluminum.

12. The method as claimed in claim 1, wherein the dielectric layer is comprised of a material selected from the group consisting of polyimide, polytetrafluoroethylene, polythiamine, polymethacrylic acid, polycarbonate, polycarbonate ester, polyester, and copolymer of imide, ethylene and dimethyl terephthate.

13. A method for manufacturing a multilayer flexible printed circuit board, the method comprising steps of:
providing a first copper clad laminate, a second copper clad laminate and a binder layer, the first copper clad laminate and the second copper clad laminate each including at least one single-sided copper clad laminate, the at least one single-sided copper clad laminate including a dielectric layer and a conductive layer formed on the dielectric layer, the first copper clad laminate having an excess portion;
defining an opening in the binder layer;
defining a first slit in the first copper clad laminate along a boundary of the excess portion of the first copper clad laminate;
laminating the first copper clad laminate, and the second copper clad laminate on opposite sides of the binder layer in a manner such that a majority of the excess portion of the first copper clad laminate is exposed to and suspended above the opening of the binder layer;
forming a via hole for establishing an electrical connection between the first copper clad laminate and the second copper clad laminate after the laminating step;
defining a second slit in the first copper clad laminate along the boundary of the excess portion of the first copper clad laminate after forming the via hole so as to remove the excess portion of the first copper clad laminate, thus a portion of the second copper clad laminate being exposed to an exterior through the opening of in the binder layer.

* * * * *